United States Patent [19]

Fournier

[11] Patent Number: 4,777,606

[45] Date of Patent: Oct. 11, 1988

[54] METHOD FOR DERIVING AN INTERCONNECTION ROUTE BETWEEN ELEMENTS IN AN INTERCONNECTION MEDIUM

[75] Inventor: Serge Fournier, Montreal, Canada

[73] Assignee: Northern Telecom Limited, Montreal, Canada

[21] Appl. No.: 870,887

[22] Filed: Jun. 5, 1986

[51] Int. Cl.⁴ .............................................. G06F 15/20
[52] U.S. Cl. .................................... 364/491; 364/489; 357/45
[58] Field of Search ............................... 364/488–491; 357/45; 29/846; 174/68.5

[56] References Cited

U.S. PATENT DOCUMENTS

| | | | |
|---|---|---|---|
| 4,441,207 | 4/1984 | Lougheed et al. | 364/490 |
| 4,495,559 | 1/1985 | Gelatt, Jr. et al. | 364/491 |
| 4,500,963 | 2/1985 | Smith et al. | 364/488 |
| 4,510,616 | 4/1985 | Lougheed et al. | 364/490 |
| 4,593,363 | 6/1986 | Burstein et al. | 364/491 |
| 4,613,941 | 9/1986 | Smith et al. | 364/490 |
| 4,615,011 | 9/1986 | Linsker | 364/491 |
| 4,636,965 | 1/1987 | Smith et al. | 364/489 |

FOREIGN PATENT DOCUMENTS 2131577 6/1984 United Kingdom .

OTHER PUBLICATIONS

IBM Technical Disclosure Bulletin, vol. 18, No. 12, May 1976, Normalized Resistance Clustering Metric.

*Primary Examiner*—Parshotam S. Lall
*Assistant Examiner*—Brian M. Mattson
*Attorney, Agent, or Firm*—Foley & Lardner, Schwartz, Jeffery, Schwaab, Mack, Blumenthal & Evans

[57] ABSTRACT

In a routing method for efficiently routing interconnections of a printed circuit board, an ordered list of interconnections to be made is first developed, each interconnection consisting of a source and a target. The interconnection medium is notionally divided into cells and, in a flooding routine for deriving the route between a particular source and target, cells at a progressively increasing distance from the source are considered. The progressive flooding is performed under a preset control by associating a respective cost with each of a number of possible flooding directions. At any time, flooding occurs from that cell to which the accumulated cost of flooding from the source is a minimum. Eventually a target cell is reached and by tracing back-pointer directions associated with the intervening cells, the least cost route is derived as a series of contiguous line segments having position, length and orientation. The same sequence is performed for all interconnections and the line segments are subsequently implemented as circuit board conductors and vias.

13 Claims, 15 Drawing Sheets

FIG. 11

| | 1 | 2 | 3 | 4 | 5 | 6 | 7 | 8 | 9 |
|---|---|---|---|---|---|---|---|---|---|
| 1 | | | | | | | | | |
| 2 | | | | | | | C | | |
| 3 | | | | | | | C | C | C |
| 4 | | C | C | | C | | C | | |
| 5 | | | | | | | C | | |
| 6 | | | | | | | C | | |
| 7 | | | | | | | | | |

INCREMENTAL COSTS
N-S 3
E-W 1
HALF 5

FIG. 12

| | 1 | 2 | 3 | 4 | 5 | 6 | 7 | 8 | 9 |
|---|---|---|---|---|---|---|---|---|---|
| 1 | | | | | | | | | |
| 2 | | | | | | | T | | |
| 3 | | | | | | | T | T | T |
| 4 | | | | | C | | T | | |
| 5 | | | | | | | T | | |
| 6 | | | | | | | T | | |
| 7 | | | | | | | | | |

INCREMENTAL COSTS
N-S 3
E-W 1
HALF 5

METHOD FOR DERIVING AN INTERCONNECTION ROUTE BETWEEN ELEMENTS IN AN INTERCONNECTION MEDIUM

This invention relates to a routing method suitable for generating routes for implementing efficient interconnection of integrated circuit packages in a multilayer circuit board.

In a circuit board design method there are two primary steps: deciding where integrated circuit packages will be placed and deciding where conductors should be routed to interconnect the packages. This invention is concerned with routing conductors after the package positions have been set.

In the specification, the following definitions apply.

Element—one of a number of items having a specific shape, size and XYZ position which are to be selectively interconnected.

Signal—elements have the same signal if they are, or must be, connected.

Summet—elements have the same summet if they are connected.

Disconnections—if two elements have the same signal, but different sumnets, then a disconnection exists between them.

Interconnections—that selection from the disconnections obtained by applying the "minimum spanning tree" (MST) algorithm; also called "work to be done".

Route—a series of contiguous linear elements of specific length, orientation, and position which together define a path between two elements.

Cell—a sub-division of the interconnection medium.

A classical algorithm used for deriving interconnection routes for printed circuit boards is the Lee algorithm. While adequate for simple structures where the number of disconnections is low, the Lee algorithm requires an inordinate amount of memory is used for multi-chip circuit boards where there might be of the order of 4,000 disconnections.

According to one aspect of the invention, there is provided a method of deriving interconnection routes between elements in a connection medium comprising the steps of:

(i) generating a cell map consisting of a number of addressable cells representing grid positions in the connection medium;

(ii) storing a plurality of pointer directions according to permissible route segment orientations, each of the pointer directions having an associated cost;

(iii) setting up a series of cost bins from a least cost bin upwards, each bin for storing data items having a cell address and an associated pointer direction;

(iv) for a list of interconnections, designating certain of the addressable cells which can accommodate routes as empty and designating other cells which cannot accommodate routes as full;

(v) selecting an interconnection having source and target elements each made up of a number of connected cells;

(vi) assigning the source cell addresses to a 0 cost bin;

(vii) selecting a cell from the least cost (n) bin containing cell addresses and entering its pointer direction in the corresponding address of the cell map;

(viii) considering cells immediately adjacent to the selected cell;

(ix) accessing a backpointer direction for each considered cell, being a direction back to the selected cell from the considered cell;

(x) if the considered cell is in the source element, placing the cell address in the cost n bin and if the considered cell is empty and has a pointer direction of cost m, placing the cell address in the cost (n+m) bin;

(xi) repeating the steps (vii) to (x) for each cell listed in the cost n bin;

(xii) repeating the step (xi) for progressively higher cost bins until a target cell is selected;

(xiii) retracing backpointers from the target cell to the source;

(xiv) recording the route of said retracted pointers;

(xv) repeating steps (v) to (xiv) for other interconnections.

The cells can be rectangular cells derived by notionally dividing the board area. The cell addresses can further include a layer level. Preferably such cells are of identical size.

The pointer directions can comprise compass directions north, south, east, west, northeast, northwest, southeast, southwest, up and down, the compass pointer directions representing directions to eight four-sided square cells which exist around a four-sided cell, and the up and down pointer directions representing directions from one map layer respectively to an overlying and an underlying map layer. Other flags stored within the cell map can be used to show why a cell is full. Such flags can show vias to an overlying or underlying board layer, or board edge cells, conductors or elements, and target and seed cells.

Preferably each of the cells within the cell memory map has associated therewith an address, a permanent store within which is stored data representing the condition of the cell in the completed map, and a temporary store representing a temporary condition within the cell during operation of a flooding routine comprising steps (vii) to (xiii).

The method can further utilize a road map indicative of cell addresses where certain route orientations are not permitted, the method comprising inspecting the road map after each cell selection to show rapidly in which orientations routes are permitted.

An embodiment of the invention will now be described by way of example with reference to the accompanying drawings in which:

FIGS. 9 to 27 show grid representations of part of a circuit board during successive stages in the operation of a flooding algorithm used to derive a route between source and target cells; and FIGS. 28 to 31 show grid representations of part of a circuit board showing operation of a road map feature of the flooding algorithm.

Figure 1:
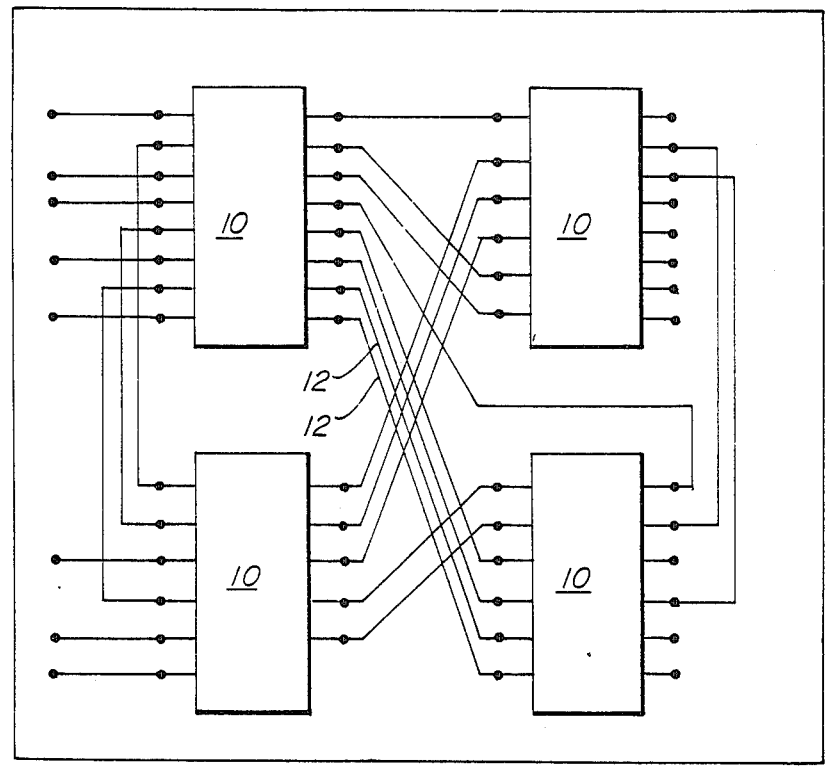
FIG. 1 is a schematic plan view of a printed circuit board showing a number of direct spanning conductor routes between integrated circuit chips.

As shown in FIG. 1, the shortest routes for interconnecting integrated circuit packages 10 are routes extending directly between the IC package pins 12. However, this arrangement gives rise to many overlapping routes. This is untenable since overlapping routes can only be electrically separated by employing a large number of circuit board layers insulated from one another.

Figure 2:
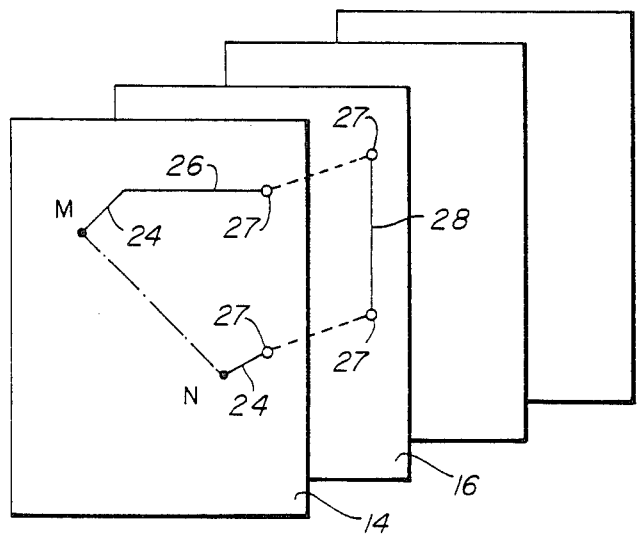
FIG. 2 shows a grid representation of part of a simple multilayer circuit board showing a single interconnection and its corresponding conductor route.

Shown in FIG. 2 is a typical practical route between points M and N at the top layer of a four-layer board. The route includes two short diagonal segments 24 and an east-west segment 26 on a top board layer 14, two vias 27 to a lower board layer 16 and a north-south segment 28 on the lower layer. This route uses predominantly east-west and north-south sections. Additionally, the east-west route sections are located predominantly in board layers where there are few north-south route sections and vice versa to obtain high route density.

Figure 3:
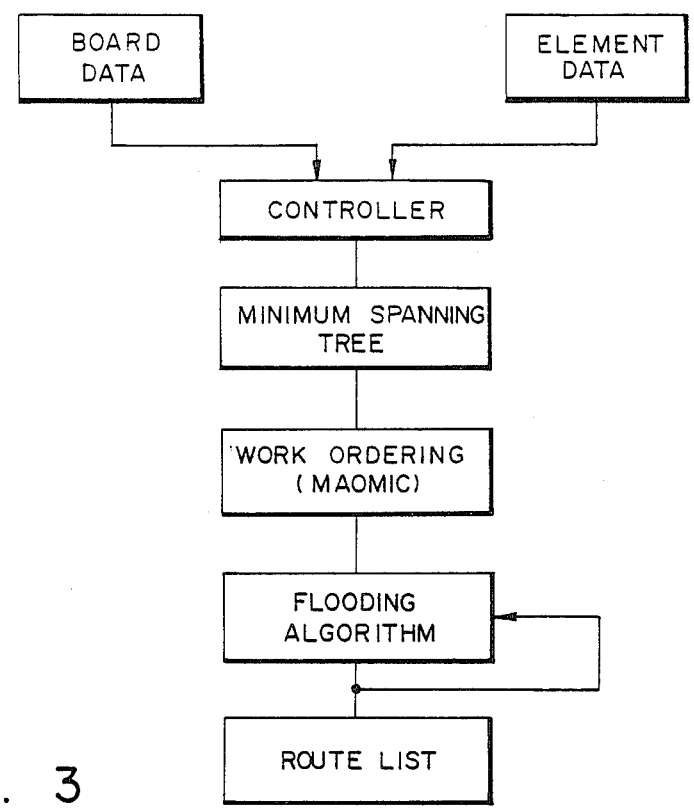
FIG. 3 is a flow diagram showing operation of a routing method according to the invention.

Referring to FIG. 3, input data for a routing method consists of board data and element data.

Typically the board date defines the board dimensions, number of board layers, a grid size, and the technology. The grid size data determines how the interconnection medium is to be notionally divided into cells, and the technology file sets certain constraints, for example, on the thickness of routes and their mutual spacing.

The element data defines the shape, size and position of elements, and the signals and sumnets of these elements. Effectively, the element data lists a set of disconnections.

The board and element data are fed to a controller which subjects data to a known minimum spanning tree (MST) algorithm to determine the minimum length of direct spans required to connect elements of the same signal. The MST algorithm selects a list of interconnections from the list of disconnections.

Subsequently at a MAOMIC (Maximum Occupancy MInimum Capacity) ordering section, the interconnections are ranked in the order in white routes are to be derived, i.e. the work order.

At a flooding section, a flooding routine is used to derive a route for each of the interconnections in turn. The output of the router is data representing a list of line segments having length, position and orientation. This output data is used to implement the routes as copper lines and vias on a printed circuit board.

Considering the various parts of the method in detail, to initialize the routing process, board data is recorded in the form of a cell memory map. The area of the multilayer board is notionally divided into a maximum of $2^{20}$ rectangular cells in an XY grid, data being stored at each of a corresponding number of cell addresses. The board is divided vertically into a number of layers so the cell addresses also include a Z component.

Figure 4:
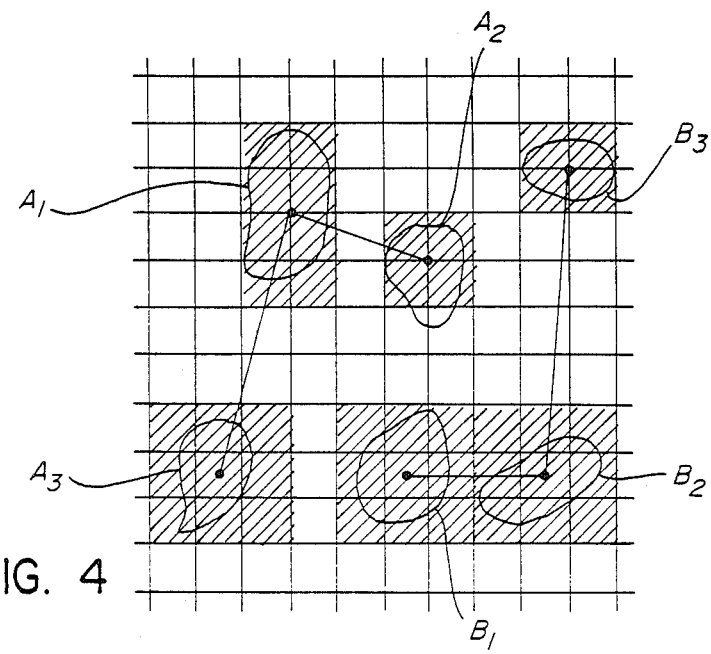
FIG. 4 shows a grid representation of a group of elements with their respective signal and summet data.

As indicated previously a selection of interconnections is made from the disconnections using the MST algorithm. Thus referring to FIG. 4, any three elements $A_1$, $A_2$ and $A_3$ having the same signal but different sumnet can be connected by disconnections $A_1A_2$ and $A_2A_3$ or $A_1A_3$ and $A_1A_2$, or $A_1A_3$ and $A_3A_2$. Using the MST algorithm each element is analyzed to define the boundary of a rectangle into which it fits. The center of the rectangle is given XY coordinates as are all other rectangles derived from elements of the same signal. The interconnections for those common signal elements are then listed starting with the minimum length required to effect an interconnection between two centers, then the next longest, etcetera until all elements of the same signal would, if the interconnections were actually made, have the same summet.

As briefly indicated previously, a list corresponding to the order in which routes are to be derived is then derived from the unordered MST list.

Sorting of interconnections may be based on any one of a number of known ordering schemes and multiple passes through a flooding routine described subsequently may utilize different ones of the ordering schemes. During at least one pass through the ordering routine, the order for assigning routes depends on a set of MAOMIC factors.

To develop the MAOMIC factors, the board and element data is first mapped onto the memory map. At each cell within the memory map, there is a permanent and a temporary storage location. In a cell encoding process, each of the cells is given one of the flags 00 to 15 which are listed below together with their binary coded decimal equivalents.

| 00 | CELL EMPTY AND AVAILABLE FOR INTERCONNECTION | 0000 |
| 01 | CELL RESTRICTED BY VIA THROUGH BOARD | 0001 |
| 02 | EDGE CELL | 0010 |
| 03 | TARGET CELL | 0011 |
| 04 | COPPER OR COMPONENT ALREADY PRESENT | 0100 |
| 05 | SEED CELL | 0101 |
| 06 | NORTH | 0110 |
| 07 | SOUTH | 0111 |
| 08 | EAST | 1000 |
| 09 | WEST | 1001 |
| 10 | NORTHWEST | 1010 |
| 11 | SOUTHWEST | 1011 |
| 12 | SOUTHEAST | 1100 |
| 13 | NORTHEAST | 1101 |
| 14 | UP | 1110 |
| 15 | DOWN | 1111 |

As a result of the encoding process, certain of the cells are recorded as empty (00) and therefore available for flooding whereas the others are recorded as full (01 to 15).

Figure 5:
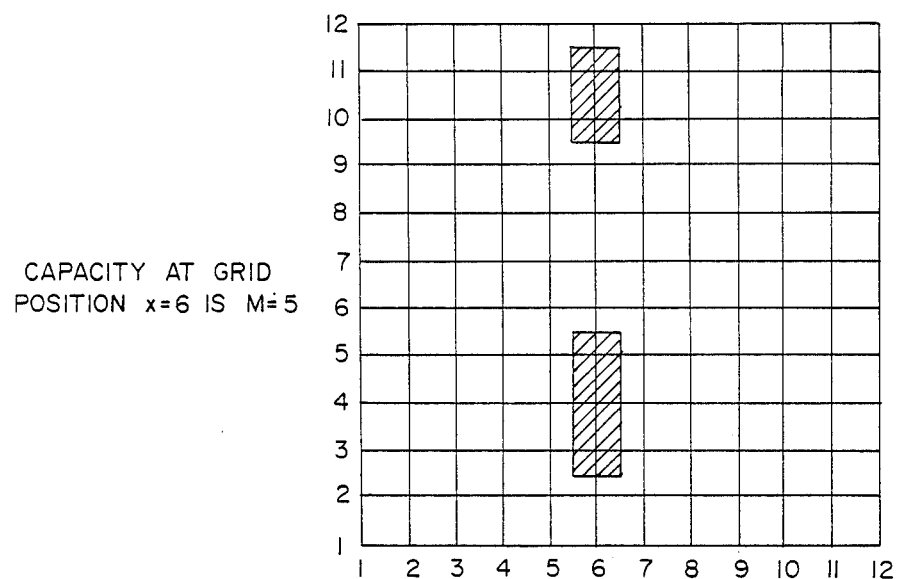
FIGS. 5 to 8 show grid representations of part of a circuit board showing the occupancy and capacity of several grid lines.
Figure 6:
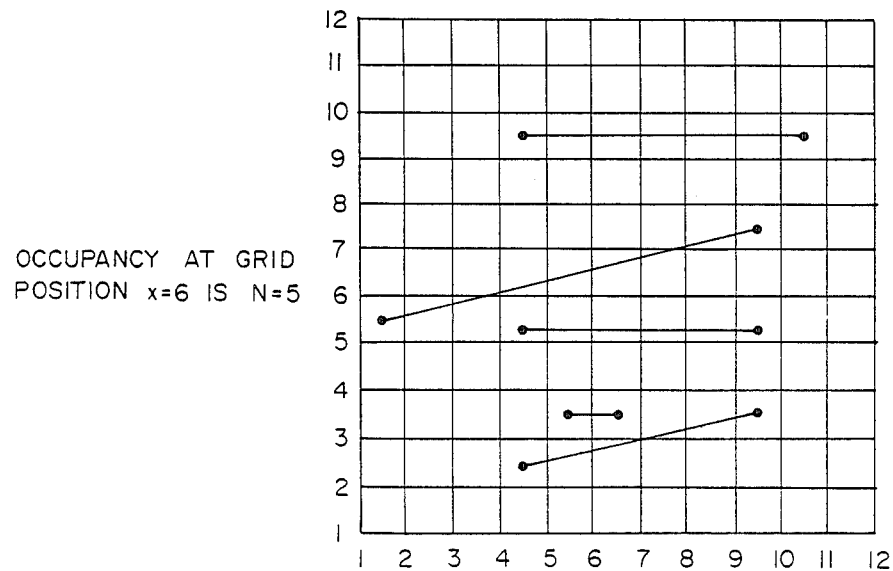
Figure 7:
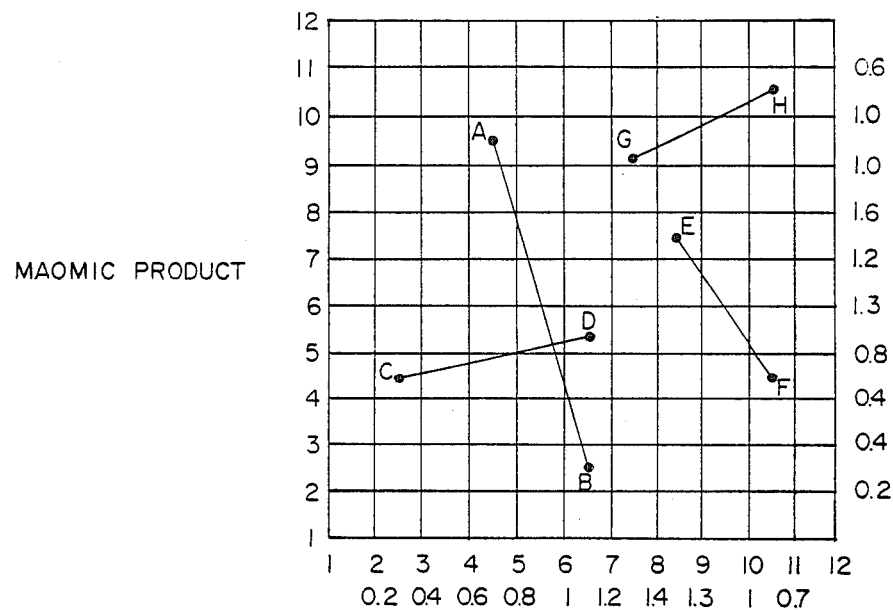

With reference to FIG. 5, to obtain a MAOMIC factor, the vertical and horizontal grid lines defining cell positions are considered and for each grid line, a capacity assessment (N) is made, FIG. 5, this being the number of cells or grid positions along the length of the grid line that are empty and therefore can accommodate a route crossing. As shown in FIG. 5, five out of the ten possible horizontal grid lines are full at the vertical $x=6$ (N=5). Then an occupacy assessment (M) is made as to how many connections would, if made to span directly between elements, cross each grid line. As shown in FIG. 6, five routes would cross grid line $x=6$ if the routes were directly drawn (M=5). MAOMIC factors, being the products of the occupancy and inverse capacity, are derived for each grid line, the MAOMIC factor of $x=6$ being $M \times 1/N = 1$. A MAOMIC factor is derived from every vertical and horizontal grid line. Each interconnection is then labelled with the highest MAOMIC product of all the grid lines which it crosses. Thus, in the five interconnections of FIG. 7, the MAOMIC factors are AB: 1.6, GH: 1.4, EF:1.3 and CD: 1.0. The work to be done is then listed in decreasing MAOMIC factor order. In the embodiment described, the grid spacing is the same as the permitted conductor route spacing to facilitate derivation of the MAOMIC factors. The circuit board of FIG. 5 is simplified in that it is two-dimensional, consisting of a single board layer. However, the MAOMIC factor can be readily derived for grids of a three-dimensional interconnection medium.

The MAOMIC routine results in a work order list of pairs of elements requiring interconnection.

As part of the cell encoding procedure, the cell data is crystallized. During crystallization and referring to FIG. 8, a cell is selected within each element to be the seed cells (05). The other cells of the element, i.e. those having the same signal and sumnet, are considered. Each of the cells is related to the element seed by a system of backpointers (06 to 15), the pointers being north, south, east, west, northwest, southwest, southeast, up (for a cell in an underlying board layer) and down (for a cell in an overlying board layer).

Figure 8:
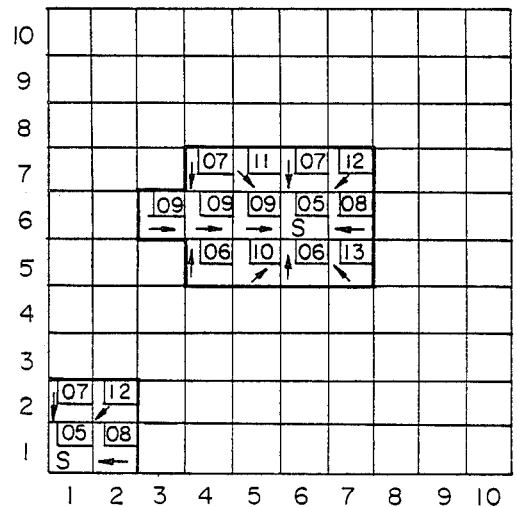

Referring to FIG. 8, a seed cell shown as S is located at position (6,6). The cells around (6,6) have pointer directions corresponding to the cardinal and half-cardinal points. Back pointer directions for the next outer layer of cells within the element are assigned by successively considering the inner cells as temporary seeds and so on until backpointers have been allocated to all of the elements in the MAOMIC listing.

In the flooding routine each of the listed pairs of elements are considered in turn. The smaller element is selected as a source area and the other as a target area (FIG. 8). The backpointer data of the target cells is deleted and is replaced by target (03) encoding.

The principle of the flooding routine is then tentatively to move from the source into surrounding successive fronts of empty cells of the memory map until the target is reached. In the memory map initially derived, each cell has in its permanent store a flag which indicates whether the cell is full (01 to 15) or available for flooding (00) and if it is full, the reason why. A full cell is not available for interconnection routing. The possible flags with binary coded flag data are as shown previously.

In geometrical terms, the length of moving from one cell to another is the length of a single cell. However in according routes to a particular layer of a circuit board, it is preferred that the copper routes on any one layer extend predominantly in one direction to obtain maximum packing density. Thus typically in a top board layer, copper routes may be predominantly north-south and in an underlying layer predominantly east-west. So that the layer routing preference can be taken account of in the flooding routine, the north and south pointer directions are given a lower cost than the east and west pointer directions in the top board and vice versa in the lower board layer. The half-cardinal directions such as northeast and southwest are registered as more costly and the vertical routes up and down are registered as the most costly. The cost of the routes is selected for a particular board design. A typical pointer cost list is shown below. The list corresponds to a four-layer board in which north-south routing is predominant in layers 1 and 3 and east-west routing is predominant in layers 0 and 2. In this cost list, a "0" cost means thet routing in such a direction is not permitted.

|  | N | S | E | W | NE | NW | SE | SW | UP | DN |
|---|---|---|---|---|----|----|----|----|----|----|
| Board layer 0 | 0 | 0 | 1 | 1 | 9 | 9 | 9 | 9 | 3 | 3 |
| Board layer 1 | 1 | 1 | 0 | 0 | 9 | 9 | 9 | 9 | 3 | 3 |
| Board layer 2 | 0 | 0 | 1 | 1 | 9 | 9 | 9 | 9 | 3 | 3 |

-continued

|  | N | S | E | W | NE | NW | SE | SW | UP | DN |
|---|---|---|---|---|----|----|----|----|----|----|
| Board layer 3 | 1 | 1 | 0 | 0 | 9 | 9 | 9 | 9 | 3 | 3 |

For operating the flooding routine, $2^8$ storage bins are set up for storing cell addresses corresponding to a particular route cost, i.e. the cost of moving to a cell from a source seed cell. To derive a route, the addresses of all cells of the source are first stacked into a cost 0 bin. The cost of a route from the source seed to another cell in the source is 0 since the source is a single set of interconnected full cells representing a single conducting entity. As a move is made into a cell which is not the source, however, the cost is increased from 0.

In the flooding routine, a cell address is selected from the lowest cost bin containing cell addresses, for example, the bin of cost A. Whenever a cell is selected from a bin, its address and backpointer direction are transferred to the temporary store in the memory map. Cells adjacent to the selected cell are inspected. If an inspected cell is not full, then its address and the pointer direction back to the selected cell are stored in the cost $(A+X)$ bin where X is the cost of moving from the selected cell to the cell being inspected. The remaining empty cells around the selected cell are then inspected in turn. The same procedure is adapted for the remaining cells in the cost A bin. Initially the cells are selected from the cost 0 bin since this is occupied by the source cells. When the cost 0 bin is empty, cells are selected from the cost 1 bin and so on.

Because normally there exist several ways to move into a particular cell from cells adjacent to it, the address of that particular cell address may appear in a number of the bins. However, once a cell has been selected and entered in the temporary store of the memory map, the address of the cell is discarded from any higher order storage bins.

Eventually, after a number of iterations of the flooding routine, a target (03) cell is reached at a result of the inspection process. The flooding routine is, however, continued until a target cell has been selected from its cost bin and transferred to the memory map. Since the data related to each cell visted in the flooding routine includes a backpointer direction, the cell data is, in effect, stored in association with the data of the next cell into which flooding takes place. Thus when a target cell is reached, the path through the flooded cells by which the target cell was reached can be tracked back to the source.

Following a target strike, the routing procedure goes through ionization and recrystallization routines. In the ionization routine, the target (03) flags in the temporary storage locations of the target cells are replaced by copper flags (04). Then in the recrystallization routine, pointer directions are assigned to the target cells relative to the source seed, and these backpointer directions are assigned to the permanent store.

When a route is derived, then the pair of interconnected elements form, in effect, a single new element. The list of interconnections is immediately edited by destroying the target sumnet within the list of work to be done and replacing the interconnected elements by the new element.

The flooding routine is repeated to effect routes for each of the interconnections in order. The result stored is a list of contiguous linear route segments having length, position and orientation. The list of linear segments can be readily used in the manufacture of integrated circuit boards.

A complete example of use of the flooding algorithm including encoding and traceback steps follows with reference to FIGS. 9 to 27.

Figure 9:
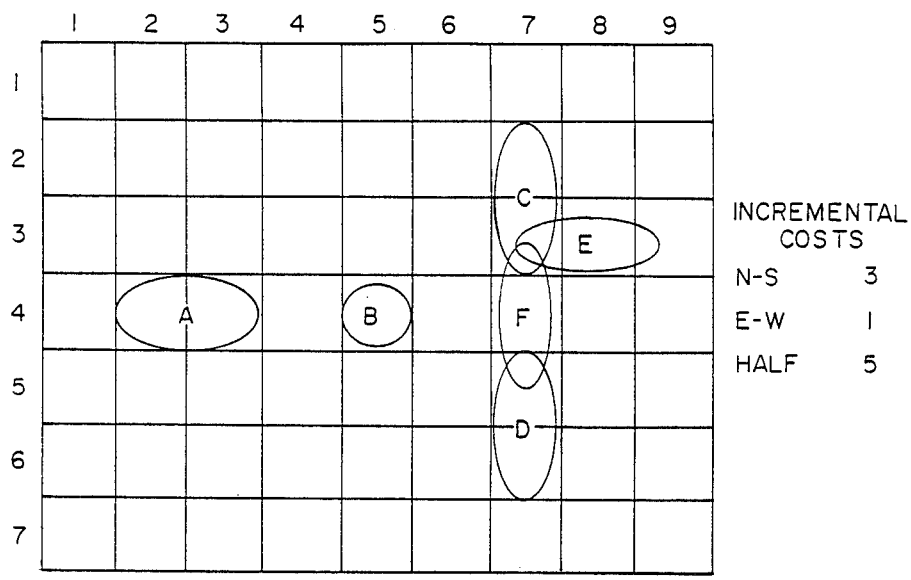

STEP 1—Input—FIG. 9

A typical input shown with 6 elements:

| A | Signal | S | Sumnet | N = Structure 1 |
| B | Signal | R | Sumnet | K = Structure 2 |
| C | Signal | S | Sumnet | M = Structure 3 |
| D | Signal | S | Sumnet | M = Structure 3 |
| E | Signal | S | Sumnet | M = Structure 3 |
| F | Signal | S | Sumnet | M = Structure 3 |

Structure 1 must be connected to structure 3 since it has the same signal but a different sumnet. Structure 2 is and must remain disconnected.

Figure 10:
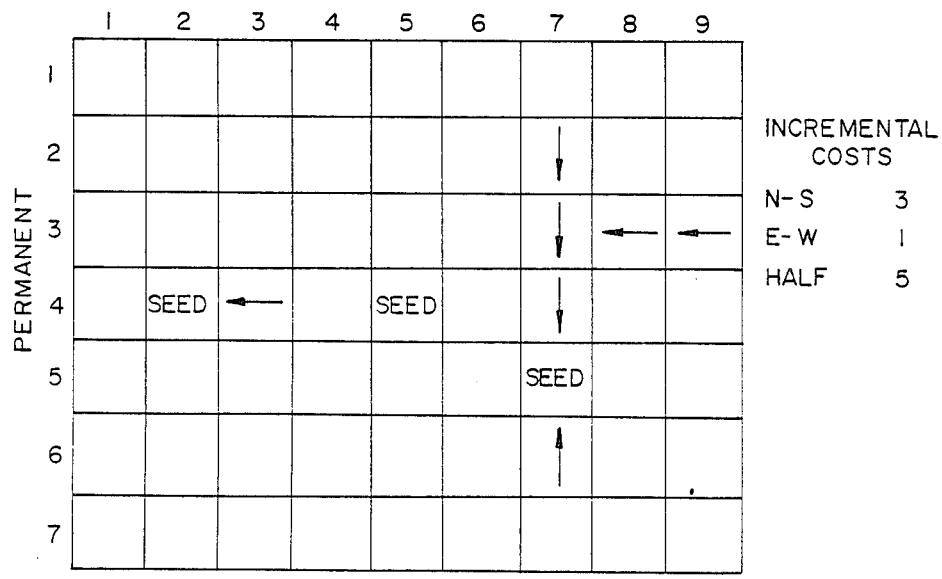

STEP 2—Encoding—FIG. 10

The permanent storage encoding of the cell map:
Structure 1 is seeded at (2,4)
Structure 2 is seeded at (5,4)
Structure 3 is seeded at (7,5)
Blank cells are empty (00)

STEP 3—Encoding—FIG. 11

The corresponding temporary storage encoding prior to flooding shows:
C=copper=04
blank=empty=00
Incremental costs are:
N−S=3
E−W=1
half-cardinal directions=5

| Cost Bin | Contents |
|---|---|
| 0 | All bins are empty |
| 1 | |
| 2 | |
| 3 | |
| 4 | |
| 5 | |
| 6 | |

STEP 4—Preparation—FIG. 12

After preparation of the source and the target, the temporary storage contents are as shown.
1. The source has been emptied and the cells are in the cost 0 bin with their proper backpointer (seed)
2. The target is marked with T=target=03

Other structures are left unchanged. Initially, permanent storage will not be modified by the flooding algorithm.

| Cost Bin | Contents |
|---|---|
| 0 | (2,4) seed (3,4) |
| 1 | |
| 2 | |
| 3 | |
| 4 | |
| 5 | |
| 6 | |

Figures 13, 14:
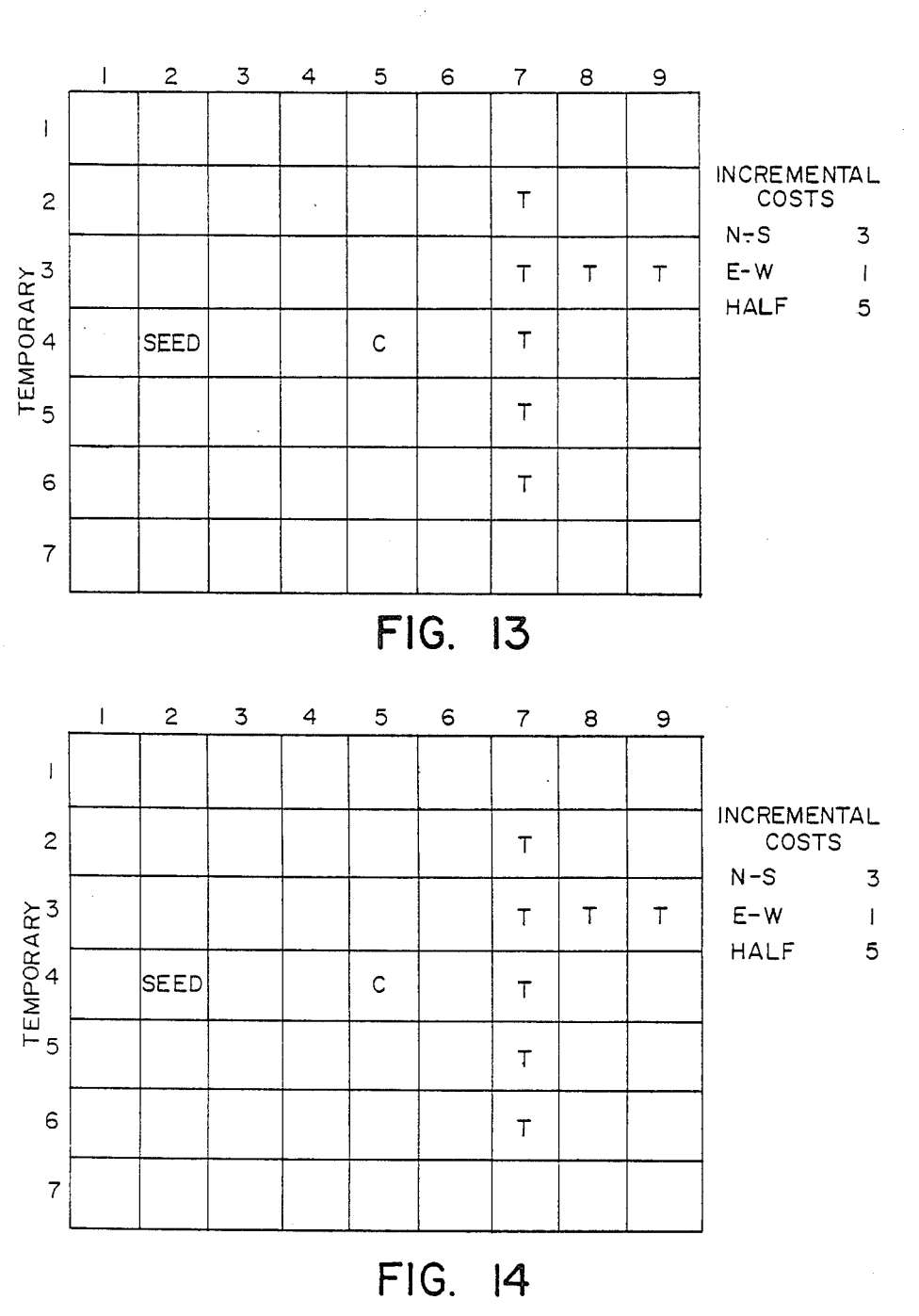

STEP 5—Extract—FIG. 13

The first cell from the least cost bin (0) is picked up. This is the (2,4) seed having a base cost=0.

The temporary storage at (2,4) is checked for empty; it is.

The backpointer (seed) is written in temporary storage.

Then the visit of the eight neighboring cells begins; Going North first, the cell at (2,3) is examined.

It is empty; so its address and a backpointer (south) is stored in bin of cost=base cost+increased cost of North, i.e. the (bin for cost=0+3=3)

| Cost Bin | Contents |
|---|---|
| 0 | (3,4) seed |
| 1 | |
| 2 | |
| 3 | (2,3) S |
| 4 | |
| 5 | |
| 6 | |

STEP 6—Visit—FIG. 14

Next visit the other neighboring cells

| Neighbor | Address | Empty | Backpointer | Incr. Cost | Bin |
|---|---|---|---|---|---|
| South | (2,5) | yes | N | +3 | 3 |
| East | (3,4) | yes | W | +1 | 1 |
| West | (1,4) | yes | E | +1 | 1 |
| Northeast | (3,3) | yes | SW | +5 | 5 |
| Northwest | (1,3) | yes | SE | +5 | 5 |
| Southeast | (3,5) | yes | NW | +5 | 5 |
| Southwest | (1,5) | yes | NE | +5 | 5 |

| Cost Bin | Contents |
|---|---|
| 0 | (3,4) seed |
| 1 | (3,4) W (1,4) E |
| 2 | |
| 3 | (2,3) S (2,5) N |
| 4 | |
| 5 | (3,3) SW (1,3) SE (3,5) NW (1,5) NE |

Figures 15, 16:
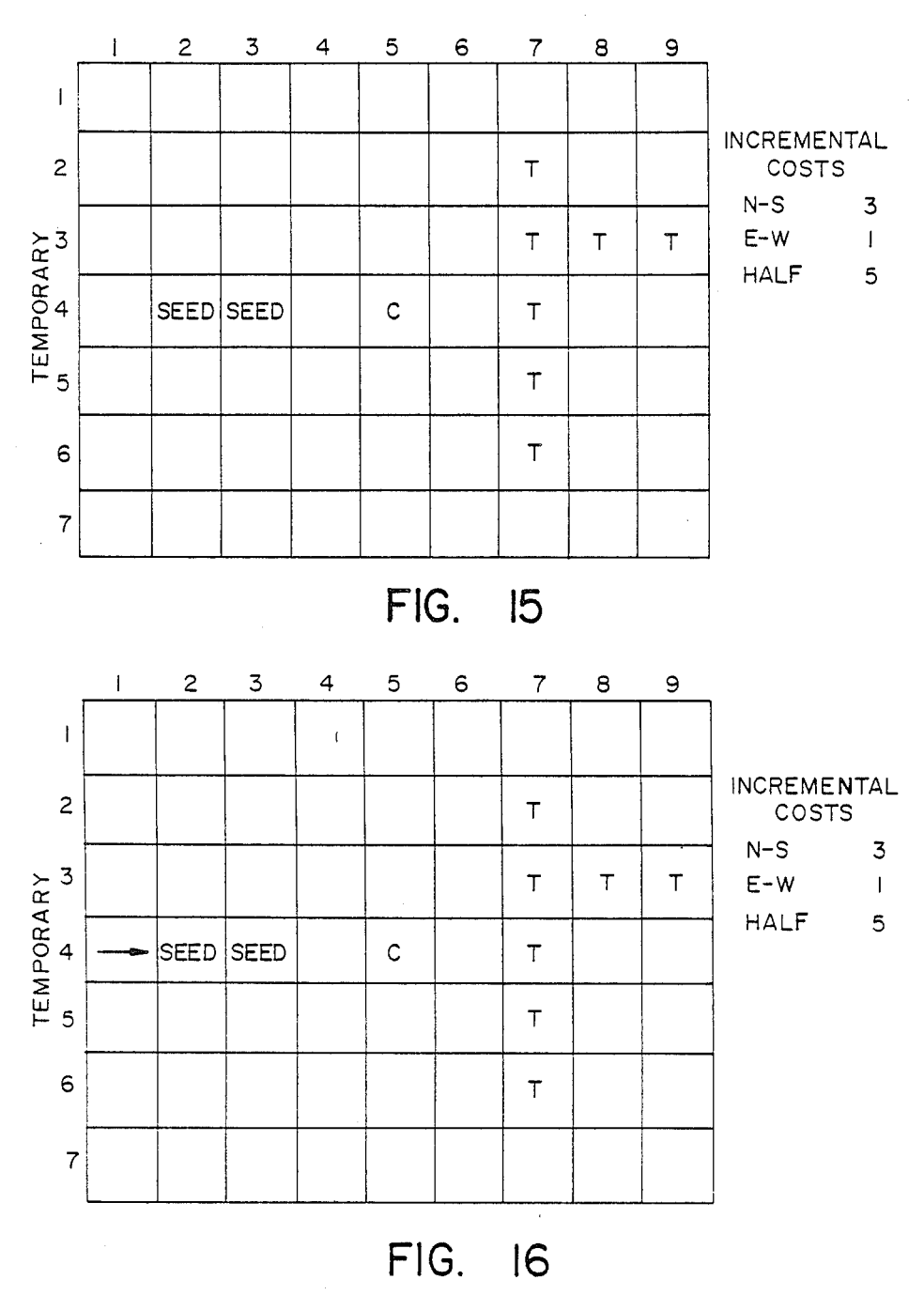

STEP 7—Flood—FIG. 15

Extract the next cell from the least cost non-empty bin. This is cell (3,4) in the bin of cost 0. The cell at (3,4) temporary store is empty. Visit neighbors.

| Neighbor | Address | Empty | Backpointer | Inc. Cost | Bin |
|---|---|---|---|---|---|
| N | (3,3) | yes | S | +3 | 3 |
| S | (3,5) | yes | N | +3 | 3 |
| E | (4,4) | yes | W | +1 | 1 |
| W | (2,4) | no | | | |
| NE | (4,3) | yes | SW | +5 | 5 |
| NW | (2,3) | yes | SE | +5 | 5 |
| SE | (4,5) | yes | NW | +5 | 5 |
| SW | (2,5) | yes | NE | +5 | 5 |

| Cost Bin | Contents |
|---|---|
| 0 | |
| 1 | (1,4) E (4,4) W |
| 2 | |
| 3 | (2,3) S (2,5) N (3,3) S (3,5) N |
| 4 | |
| 5 | (3,3) SW (1,3) SE (3,5) NW (1,5) NE (4,3) SW (2,3) SE (4,5) NW (2,5) NE |
| 6 | |

STEP 8—Flood—FIG. 16

Extract next cell from the least cost non-empty bin (1) (1,4) East having base cost=1. Cell at (1,4) temporary is empty.

| Neighbor | Address | Empty | Backpointer | Inc. Cost | Bin |
|---|---|---|---|---|---|
| N  | (1,3) | yes | S  | +3 | 4 |
| S  | (1,5) | yes | N  | +3 | 4 |
| E  | (2,4) | no  | —  | —  | — |
| W  | —     | —   | —  | —  | — |
| NE | (2,3) | yes | SW | +5 | 6 |
| NW | —     | —   | —  | —  | — |
| SE | (2,5) | yes | NW | +5 | 6 |
| SW | —     | —   | —  | —  | — |

| Cost Bin | Contents |
|---|---|
| 0 | |
| 1 | (4,4) W |
| 2 | |
| 3 | (2,3) S (2,5) N (3,3) S (3,5) N |
| 4 | (1,3) S (1,5) N |
| 5 | (3,3) SW (1,3) SE (3,5) NW (1,5) NE<br>(4,3) SW (2,3) SE (4,5) NW (2,5) NE |
| 6 | (2,3) SW (2,5) NW |

Figure 17:
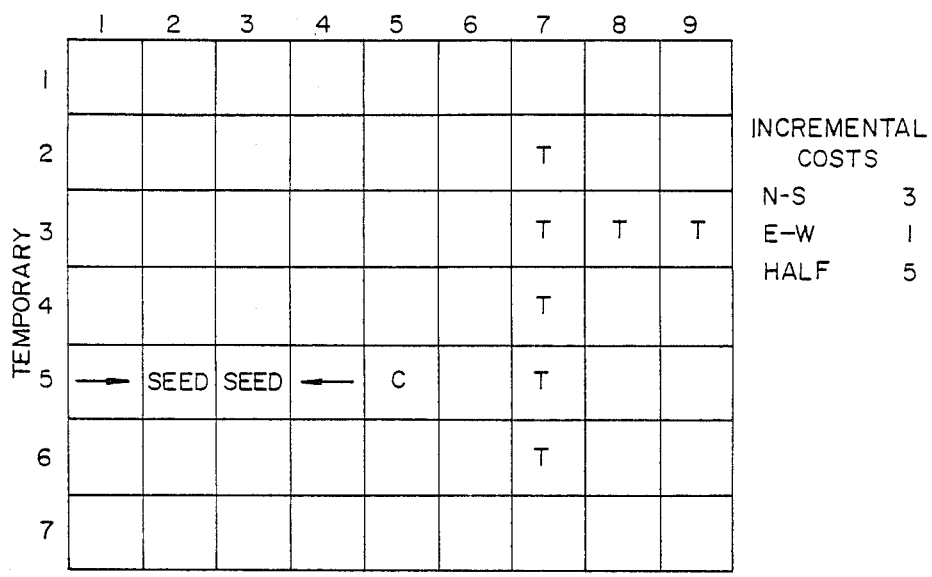

STEP 9—Flood—FIG. 17

Extract cell from the least cost non-empty bin (1) (4,4) West, base cost=1; cell at (4,4) temporary is empty.

| Neighbor | Address | Empty | Backpointer | Incr. Cost | Bin |
|---|---|---|---|---|---|
| N  | (4,3) | yes | S  | +3 | 4 |
| S  | (4,5) | yes | N  | +3 | 4 |
| E  | (5,4) | no  | obstacle not to be run over | | |
| W  | (3,4) | no  | already reached at a lower cost | | |
| NE | (5,3) | yes | SW | +5 | 6 |
| NW | (3,3) | yes | SE | +5 | 6 |
| SE | (5,5) | yes | NW | +5 | 6 |
| SW | (3,5) | yes | NE | +5 | 6 |

| Cost Bin | Contents |
|---|---|
| 0 | |
| 1 | |
| 2 | |
| 3 | (2,3) S (2,5) N (3,3) S (3,5) N |
| 4 | (1,3) S (1,5) N (4,3) S (4,5) N |
| 5 | (3,3) SW (1,3) SE (3,5) NW (1,5) NE<br>(4,3) SW (2,3) SE (4,5) NW (2,5) NE |
| 6 | (2,3) SW (2,5) NW (5,3) SW (3,3) SE<br>(5,5) NW (3,5) NE |

Figure 18:
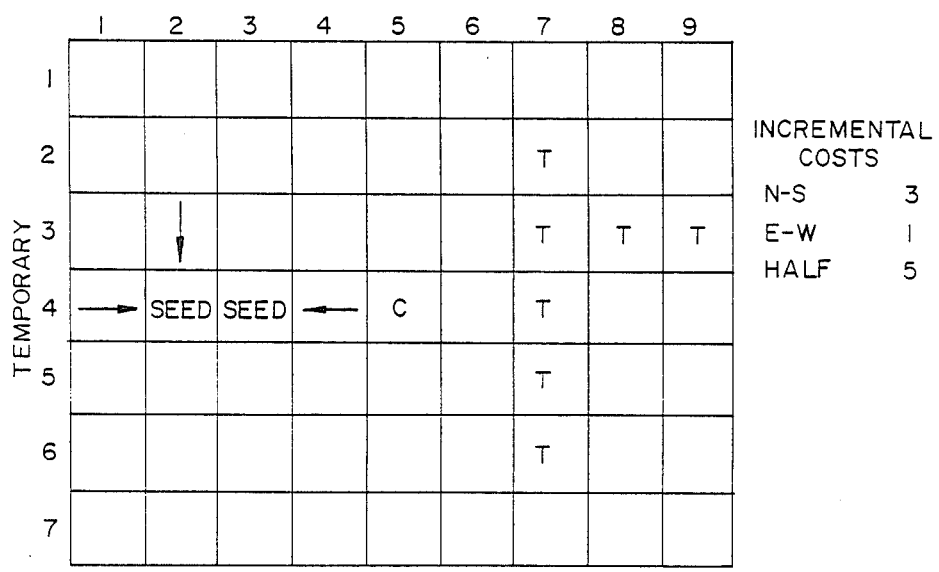

STEP 10—Flood—FIG. 18

Extract cell from the least cost, non-empty bin (3) (2,3) South, base cost=3; cell at (2,3) temporary is empty.

The visit to neighboring cells proceeds as before. For brevity purposes, the second appearance of the address of cells in the cost bins is replaced by a dot. The validity of this simplification is explained in step 13.

| Cost Bin | Contents |
|---|---|
| 0 | |
| 1 | |
| 2 | |
| 3 | (2,5) N (3,3) S (3,5) N |
| 4 | (1,3) S (1,5) N (4,3) S (4,5) N<br>(3,3) W (1,3) E |
| 5 | ........ |
| 6 | .. (5,3) SW . (5,5) NW . (2,2) S |

Figure 19:
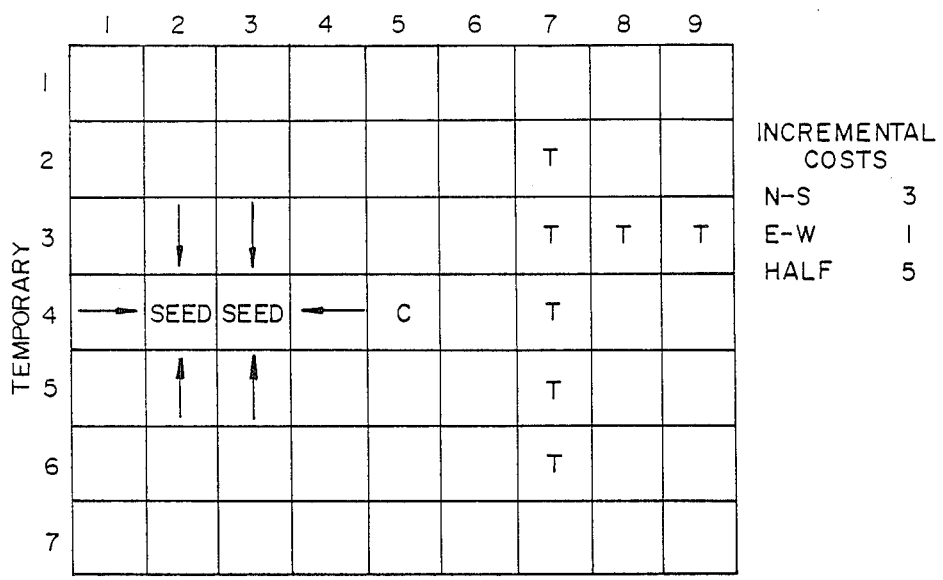

STEP 11—Flood—FIG. 19

The last three addresses are extracted from the least cost bin (3) and their neighbors are visited.

| Cost Bin | Contents |
|---|---|
| 0 | |
| 1 | |
| 2 | |
| 3 | |
| 4 | (1,3) S (1,5) N (4,3) S (4,5) N (3,3) W<br>(1,3) E (3,5) W (1,5) E (4,3) W (4,5) W |
| 5 | ........ |
| 6 | .. (5,3) SW . (5,5) NW . (2,2) S (2,6) N<br>(3,2) S (3,6) N |

Figure 20:
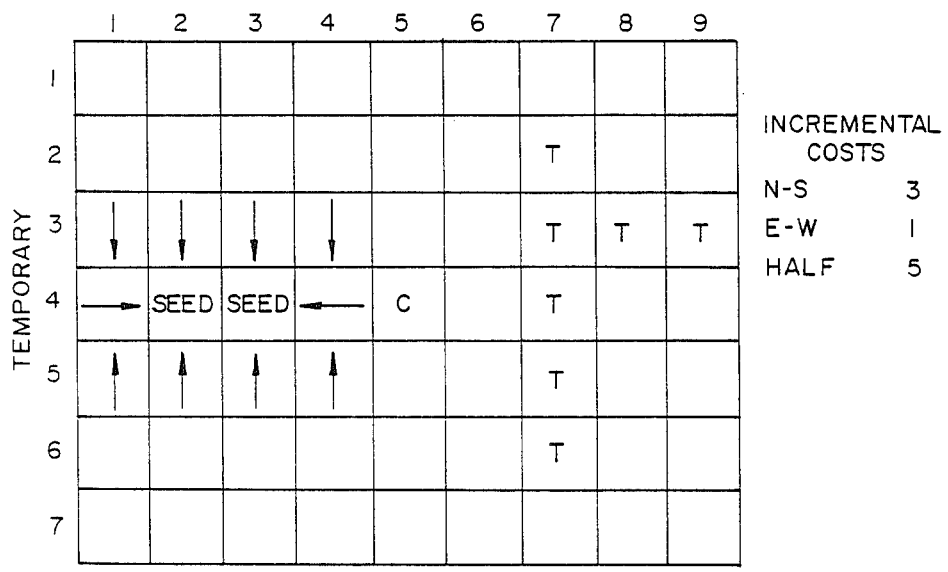

STEP 12—Flood—FIG. 20

The first four cells are then extracted from least cost bin (4) and their neighbors are visited.

| Cost Bin | Contents |
|---|---|
| 0 | |
| 1 | |
| 2 | |
| 3 | |
| 4 | (3,3) W (1,3) E (3,5) W (1,5) E (4,3) W<br>(4,5) W |
| 5 | ........ (5,3) W (5,5) W |
| 6 | ...... (2,3) S (2,6) N (3,2) S<br>(3,6) N |

Figure 21:
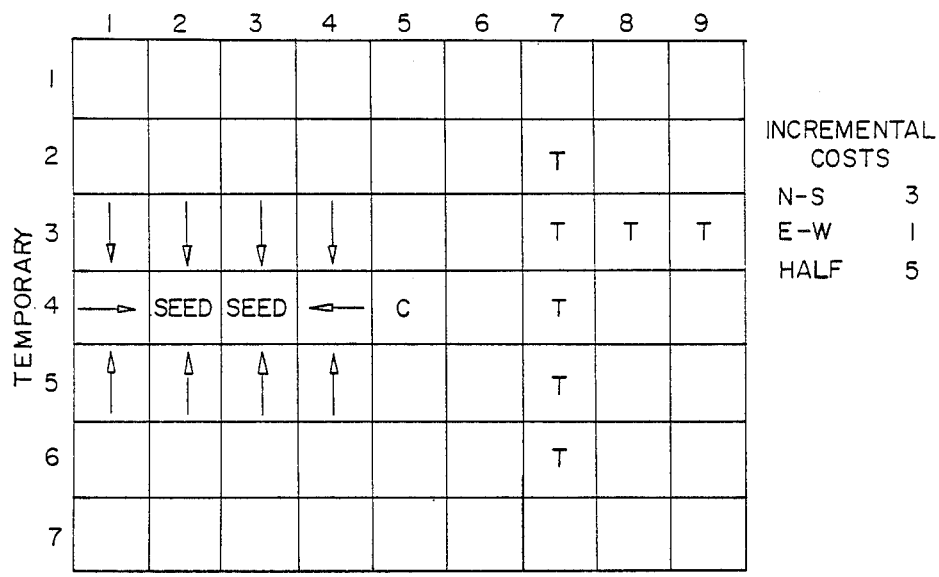

STEP 13—Flood—FIG. 21

Extract the next address from the least cost non-empty bin (4) (3,3) W, base cost=4; cell at (3,3) temporary is not empty. This means that that cell already flooded is at a lesser or equal cost and so no visit to it is required.

| Cost Bin | Contents |
|---|---|
| 0 | |
| 1 | |
| 2 | |
| 3 | |
| 4 | (1,3) E (3,5) W (1,5) E (4,3) W (4,5) W |
| 5 | ........ (5,3) W (5,5) W |
| 6 | ...... (2,2) S (2,6) N (3,2) S<br>(3,6) N |

Figure 22:
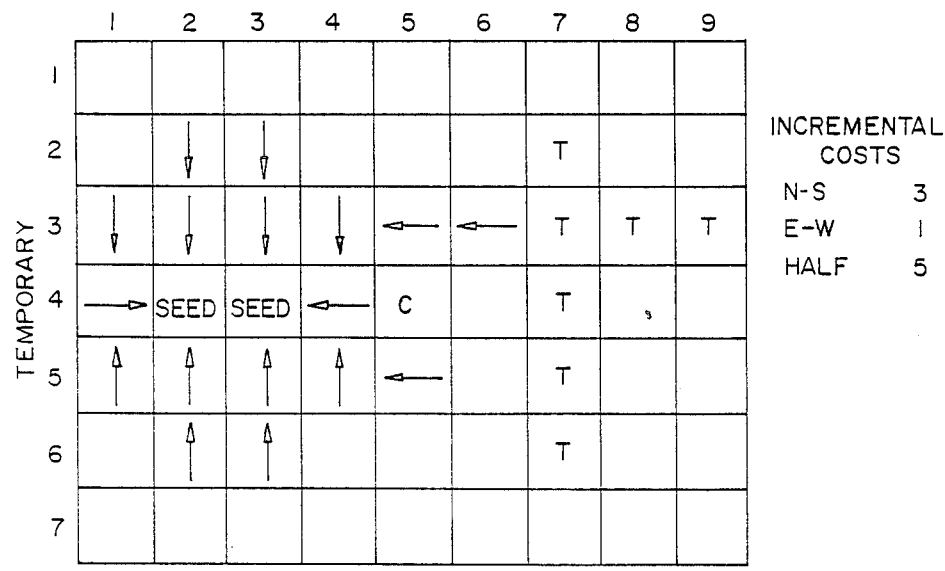

STEP 14—Flood—FIG. 22

The flooding progresses until cell (6,3) W is extracted from the least cost bin (6). It was put there by the eastward visit from cell (5,3) in cost bin 5. From (6,3) when visiting the eastward neighbor at (7,3), the temporary storage is found to contain T (target 03). The algorithm considers (7,3) to be empty and stores (7,3) W in cost bin 7. The algorithm progresses as usual.

Figure 23:
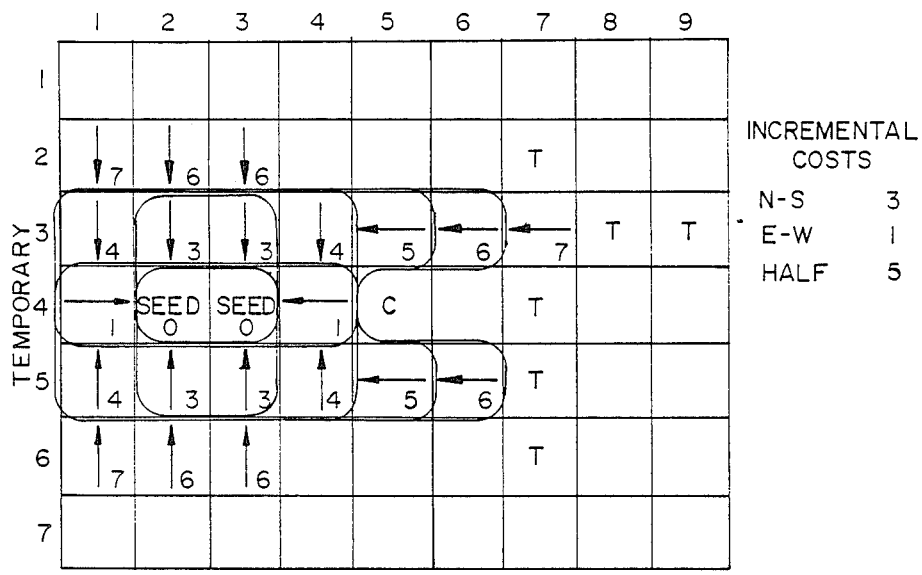

STEP 15—Finish—FIG. 23

When (7,3) W is extracted from the least cost bin 7, the temporary storage is found to contain T (target 03).

Under these circumstances, the backpointer is stored at (7,3) temporary and the flooding algorithm terminates successfully. The reach cost is 7. The numbers in FIG. 20 show the cost bins from which the backpointers are extracted to illustrate the wavefront progression of the flooding algorithm.

Figure 24:
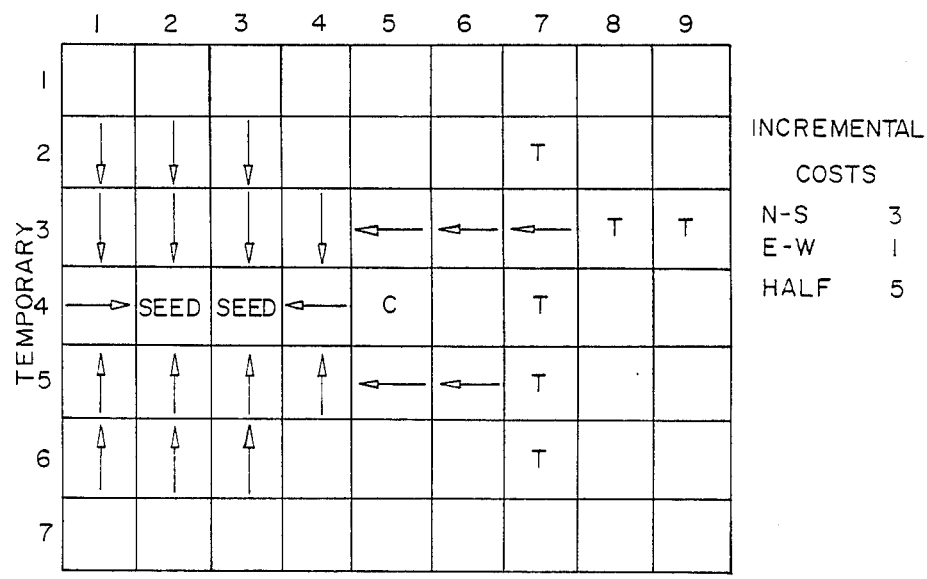

STEP 16—Traceback—FIG. 24

The traceback routine starts from (7,3) and follows the backpointers in sequence.

| | | |
|---|---|---|
| (7,3) W | | |
| (6,3) W | line 1 from (7,3) to (4,3) | = new element G (FIG. 25) |
| (5,3) W | | |
| (4,3) S | line 2 from (4,3) to (4,4) | = new element H |
| (4,4) W | | |
| (3,4) Seed | line 3 from (4,4) to (3,4) | = new element I |

STEP 17—FIG. 25

Figure 25:
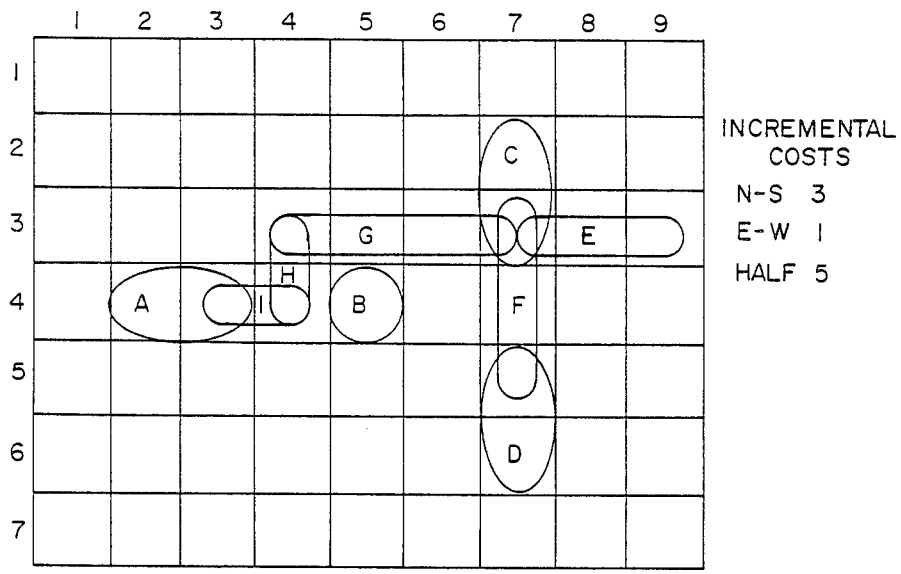

Considering FIGS. 9 and 25 the routing results in:

| | | | |
|---|---|---|---|
| A | Signal S | Sumnet N | Structure 1 |
| B | Signal R | Sumnet K | Structure 2 |
| C | Signal S | Sumnet N̲ | Structure 1 |
| D | | | Structure 1 |
| E | | | Structure 1 |
| F | | | Structure 1 |
| G | | | Structure 1 |
| H | | | Structure 1 |
| I | | | Structure 1 |

Subnet M of signal S has disappeared.

Figure 26:
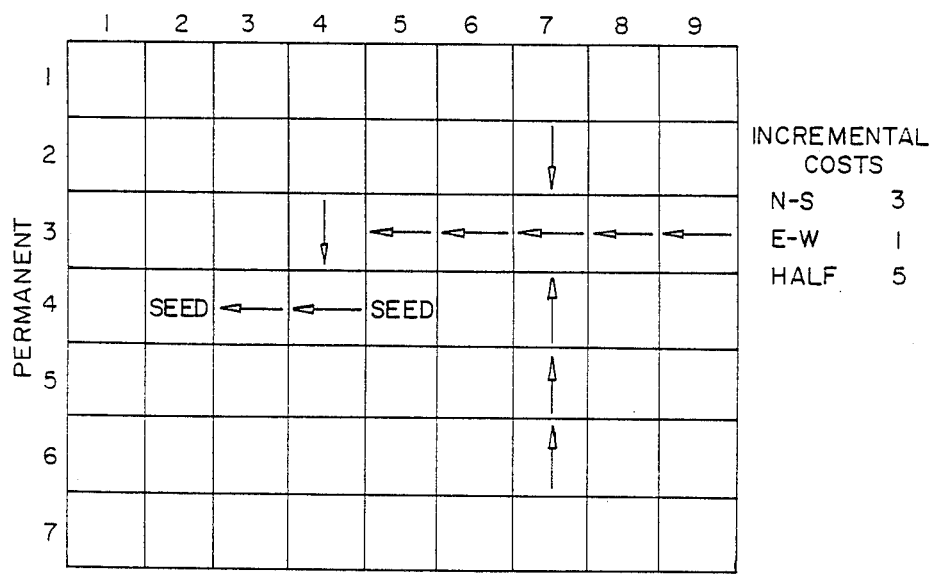

STEP 18—Clean—FIG. 26

The permanent storage structures are then adjusted as shown.

Figures 27, 28, 29:
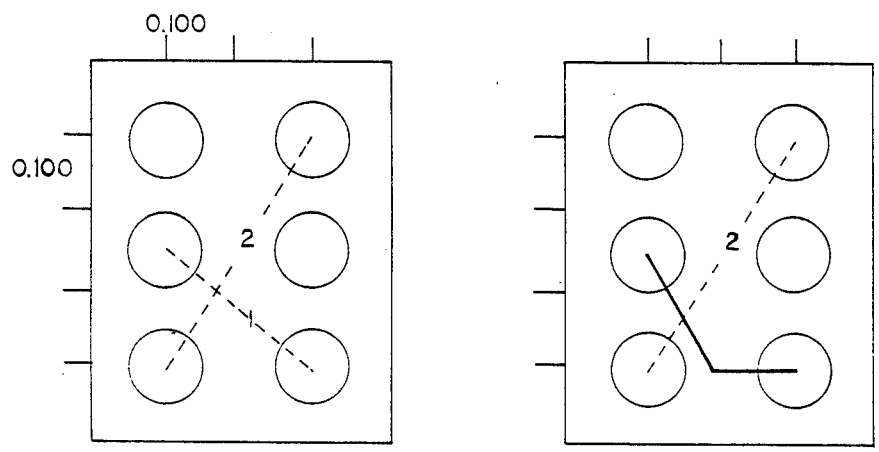

STEP 19—Clean—FIG. 27

The temporary storage is cleared of the expansion data and reset to model the contents of the permanent storage. All bins are cleared of address and backpointer data. The cell map and bins are ready for another exercise of the flooding algorithm.

In combination with the MAOMIC ordering scheme described previously, this flooding routine provides an effective compromise between route efficiency and low memory requirement.

At some locations, flooding in certain directions is not permitted. This is true for certain cardinal directions at the different board layers. It is also true close to integrated circuit pins. Thus a typical dual in-line package (DIP) has pins on 100 mil centers. The DIP packages are usually mounted within a regular array so that, considering the cell map, the top left-hand pin of a package might be at vertical height Y=N00 with the next lower pin at vertical height Y=(N−1)00 etcetera. Moreover, corresponding pins of adjacent DIPs are often interconnected. A grid of 0.020 spacing has a standard conductor spacing of 20 cells and a circular pin solder area of diameter 50 cells. This leaves room for only 2 conductors in a 100 grid spacing. To most effectively use the space around pins for routing, all route assignments are made subject to a road map which forces some routing discipline over the flooding algorithm.

In the 0.020 inch grid example, pins and vias are restricted to a 0.100 inch grid in order to make board manufacture and board testing easier. Conductors however, have no such restriction and can be placed anywhere on the 0.020 inch grid. If the flooding algorithm is left to roam freely over the cell map, inefficient use of the board area may arise as exemplified with reference to FIGS. 28 and 29. FIG. 28 shows dotted lines at interconnections to be made. The number order is the MAOMIC order. A random use of the board area would block a direct interconnection at path 2 (FIG. 29).

Figure 30:
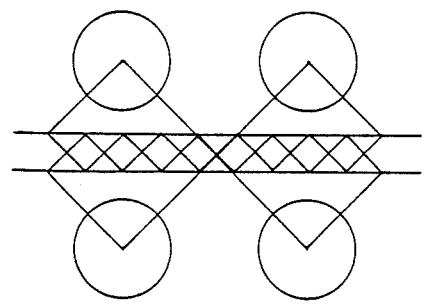
Figure 31:
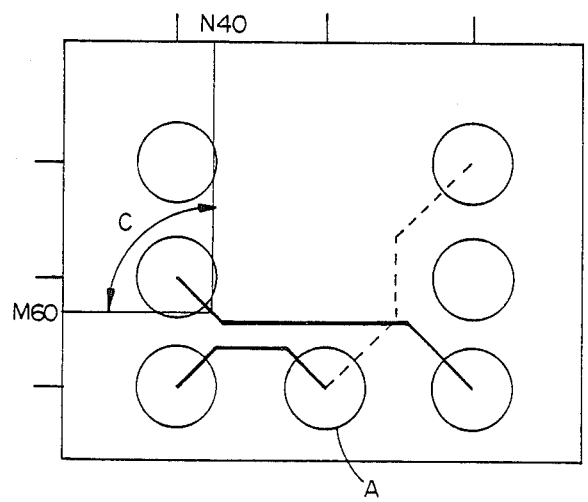

To solve this problem, the road map shown in FIG. 30 is used during the flooding process. When a cell is extracted from the least cost non-empty bin, its position on the road map is identified. For example, a cell C at (0.N40, 0.M60) is identified in FIG. 31. The road map is used to control the neighbor positioning process. In the case of C, visits are restricted to NW, W, SW, SE and E thus preventing undesirable flooding towards N, NE and S. Under road map control, the previous example is completed as shown in FIG. 31 where broken lines are tracks on a lower layer and a via is present at location A.

In this specific example, the road map keeps the flooding algorithm from grid lines 0.020 and 0.080 thus providing a better utilization of the space where vias must be positioned.

A secondary effect of the road map is substantially to reduce the amount of computer time and computer storage required to run the flooding algorithm. Time is saved by preventing undesirable visits and space is saved, by saving on bin storage.

A different technology file may have different package pin size, shape and spacing and a different grid size.

Within the confines of developing the MAOMIC work order and running the flooding algorithm, the system permits several extensions.

Thus, in one modification of the system, limits are set to the vertical travel between board layers by specifying, for example, only two vias in any interconnect route.

In another extension, an initial pass is made through the work order to assign only the most efficient straight and "L" shaped routes at a single board layer to those interconnections susceptible of such routing. In further passes through the work order, more complex routes which may extend to multiple layers are assigned.

In another modification, a ceiling can be placed on the cost of any route. When each piece of work is performed, the route, its cost, etcetera is checked against a limitation indicator.

In yet another modification, a particular margin is set. Thus considering the minimum area rectangle which can cover a source and a target to be connected to that source, the margin is the extent to which a larger rectangle extends beyond the minimum area rectangle. If a small margin is set then the interconnections must be within or very close to the minimum area rectangle.

Although the routing method is described in the context of a multilayer printed circuit board, it will be appreciated that the connection method has a more universal application.

It will be recognized that the MAOMIC and flooding routines can be performed by suitably programming a computer, the computer having a memory for storing the memory map, the temporary and permanent results of running the flooding routine, the cost bins and their contents, the road map limitations etcetera.

What is claimed is:

1. A method for deriving an interconnection route between elements in a connection medium, comprising the steps of:
(i) defining:
   (a) a cell map comprising a plurality of addressable cells representing grid positions in the connection medium,
   (b) a plurality of flags including an empty cell flag, a seed cell flag, a target cell flag, an unavailable cell flag, and a plurality of pointer direction flags, each pointer direction flag having an associated pointer direction and an associated cost; and
   (c) a plurality of cost bins, each cost bin $B_n$ being associated with a cost n and having a plurality of locations for storing data items comprising a cell address and an associated flag;
(ii) writing in software:
   (a) unavailable cell flags into cells associated with grid positions not available for routing of an interconnection;
   (b) target cell flags into cells associated with grid positions occupied by a target element; and
   (c) data items comprising addresses of cells associated with grid positions occupied by a seed element and associated seed cell flags into a cost bin $B_O$ associated with zero cost;
(iii) and repeating the following steps until a data item containing a cell address corresponding to a cell containing a target cell flag is selected:
   (a) scanning the cost bins in order of increasing associated cost until a cost bin $B_n$ containing at least one data item is located:
   (b) selecting a data item from said cost bin, and:
      (I) if an empty cell flag is stored in the cell corresponding to the cell address contained in said selected data item, said cell being a correspondent cell, overwriting the empty cell flag with the flag of the selected data item, deleting the selected data item from the cost bin and, for each cell adjacent to the correspondent cell other than cells containing unavailable cell flags, writing a data item into cost bin $B_{n+m}$, the data item comprising the address of the adjacent cell and an associated pointer direction flag, the associated pointer direction flag corresponding to a direction from the adjacent cell to the correspondent cell and m being the cost associated with said pointer direction flag; and
      (II) if the flag stored in the cell corresponding to the cell address contained in said selected data item is a pointer direction flag, deleting said selected data item from the cost bin;
wherein the derived interconnection route comprises a path from the selected cell containing a target cell flag to a cell containing a seed cell flag through intermediate cells following directions corresponding to pointer direction flags stored in said intermediate cells.

2. A method as claimed in claim 1 wherein the cells are square.

3. A method as claimed in claim 2 wherein said pointer directions comprise compass pointer directions north, south, east, west, northeast, northwest, southeast, southwest, and the directions up and down, the compass pointer directions representing directions to the eight square cells which exist adjacent a square cell in a particular map layer occupied by the cell, all of the cells being of identical area and the up, down pointer directions representing directions from the map layer respectively occupied by the cell to an overlying and an underlying map layer.

4. A method as claimed in claim 3 wherein said plurality of flags further includes a flag for designating that a cell at one layer is occupied by a via to an overlying or underlying map layer.

5. A method as claimed in claim 3 wherein said plurality of flags further includes a flag for designating an edge cell on the map.

6. A method as defined in claim 2 wherein at least one pointer direction flag has one associated cost when associated with cells in one map layer and a different associated cost when associated with cells in a different map layer.

7. A method for deriving a plurality of interconnection routes, comprising performing the method according to claim 1 for each of the plurality of interconnection routes in succession, and writing unavailable cell flags into each cell associated with each previously derived route on each successive performance of the method until the plurality of interconnection routes is exhausted.

8. A method as claimed in claim 7 wherein each of the cells within the cell map has associated therewith an address, a permanent store and a temporary store said pointer direction flags being written into said temporary stores during each successive performance of the method, and unavailable cell flags being written into said permanent stores to define each successively derived route after each successive performance of the method according to claim 1.

9. A method as claimed in claim 8 wherein following derivation of each route, pointer direction flags for cells on the derived route are transferred from the temporary to the permanent store.

10. A method according to claim 7 wherein input data includes a list of functional interconnections to be made, the method comprising ordering members of the list by:
(i) counting the number of cells containing empty cell flags in each of a plurality of rows of cells and columns of cells to define a capacity for each row and each column;
(ii) counting the number of cells in each row and each column which would be crossed by an interconnection if each interconnection extended along a straight line linking elements to be interconnected to define an occupancy for each row and each column;
(iii) dividing each row and column occupancy by a corresponding capacity to define a MAOMIC product for each row and each column;
(iv) comparing the MAOMIC products of each row and each column crossed by a straight line interconnection and sorting the maximum MAOMIC product for each interconnection; and
(v) deriving routes for said interconnections in descending order of the MAOMIC products associated with said interconnections.

11. A method as claimed in claim 10 wherein following derivation of each route joining two elements, data representing the two elements are re-written to represent a single element comprising said two elements and the derived route extending between the two elements.

12. A method as claimed in claim 1 wherein a road map indicative of cells where certain pointer direction flags are not permitted is stored, the method further comprising looking up said road map at each data item selection and writing the pointer direction flag of the selected data item into the cell map at the cell corresponding to the cell address of the data item only if said pointer direction flag is permitted at said cell.

13. A method as claimed in claim 1 further comprising translating the derived interconnection route into a set of conductor line segments and vias in a multilayer printed circuit board.

* * * * *